(12) United States Patent
Doris et al.

(10) Patent No.: US 9,455,274 B2
(45) Date of Patent: Sep. 27, 2016

(54) REPLACEMENT FIN PROCESS IN SSOI WAFER

(71) Applicant: International Business Machines Corporation, Armonk, NY (US)

(72) Inventors: Bruce B. Doris, Slingerlands, NY (US); Hong He, Schenectady, NY (US); Ali Khakifirooz, Los Altos, CA (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/609,574

(22) Filed: Jan. 30, 2015

(65) Prior Publication Data

US 2016/0225789 A1 Aug. 4, 2016

(51) Int. Cl.
*H01L 27/12* (2006.01)
*H01L 21/70* (2006.01)
(Continued)

(52) U.S. Cl.
CPC ..... *H01L 27/1207* (2013.01); *H01L 21/02532* (2013.01); *H01L 21/30604* (2013.01); *H01L 21/31111* (2013.01); *H01L 21/823431* (2013.01); *H01L 21/823821* (2013.01); *H01L 21/823878* (2013.01); *H01L 21/845* (2013.01); *H01L 27/0886* (2013.01); *H01L 27/0922* (2013.01); *H01L 27/1211* (2013.01);
(Continued)

(58) Field of Classification Search
CPC ........... H01L 27/1211; H01L 27/0886; H01L 21/845; H01L 21/823431; H01L 21/823821; H01L 29/66795; H01L 29/785; H01L 27/10879

USPC ........ 257/347, 369, 351, E27.112; 438/199, 438/478, 283
See application file for complete search history.

(56) References Cited

U.S. PATENT DOCUMENTS 6,835,618 B1 12/2004 Dakshina-Murthy et al.
7,198,990 B2 4/2007 Joshi et al.
(Continued)

OTHER PUBLICATIONS

Maszara et al., "FinFETs—Technology and Circuit Design Challenges", European Solid-State Device Research Conference (ESSDERC), 2013, pp. 3-8.
(Continued)

*Primary Examiner* — Fernando L Toledo
*Assistant Examiner* — Aaron Gray
(74) *Attorney, Agent, or Firm* — Cantor Colburn LLP; Vazken Alexanian (57) ABSTRACT

A method of forming replacement fins in a complimentary-metal-oxide-semiconductor (CMOS) device that includes a p-type field effect transistor device (pFET) and an n-type field effect transistor device (nFET) and a CMOS device are described. The method includes forming strained silicon (Si) fins from a strained silicon-on-insulator (SSOI) layer in both an nFET region and a pFET region, forming insulating layers over the strained Si fins, and forming trenches within the insulating layers to expose the strained Si fins in the pFET region only. The method also includes etching the strained Si fins in the pFET region to expose a buried oxide (BOX) layer of the SSOI layer, etching the exposed portions of the BOX layer to expose a bulk substrate, epitaxially growing a Si portion of pFET replacement fins from the bulk substrate, and epitaxially growing silicon germanium (SiGe) portions of the pFET replacement fins on the Si portion of the pFET replacement fins.

9 Claims, 13 Drawing Sheets

(51) Int. Cl.

| | | |
|---|---|---|
| H01L 21/8238 | (2006.01) | |
| H01L 21/20 | (2006.01) | |
| H01L 21/36 | (2006.01) | |
| H01L 21/84 | (2006.01) | |
| H01L 21/02 | (2006.01) | |
| H01L 21/306 | (2006.01) | |
| H01L 21/311 | (2006.01) | |
| H01L 27/092 | (2006.01) | |
| H01L 29/06 | (2006.01) | |
| H01L 29/16 | (2006.01) | |
| H01L 29/161 | (2006.01) | |
| H01L 29/78 | (2006.01) | |
| H01L 29/66 | (2006.01) | |
| H01L 21/8234 | (2006.01) | |
| H01L 27/088 | (2006.01) | |

(52) U.S. Cl.
CPC .......... *H01L29/0649* (2013.01); *H01L 29/16* (2013.01); *H01L 29/161* (2013.01); *H01L 29/66795* (2013.01); *H01L 29/785* (2013.01); *H01L 29/7849* (2013.01)

(56) References Cited

U.S. PATENT DOCUMENTS

| | | |
|---|---|---|
| 7,476,580 B2 | 1/2009 | Zhu et al. |
| 7,842,559 B2 | 11/2010 | Jakschik et al. |
| 8,481,410 B1* | 7/2013 | LiCausi et al. ............... 438/478 |
| 8,497,171 B1 | 7/2013 | Wu et al. |
| 8,673,718 B2 | 3/2014 | Maszara et al. |
| 2007/0063276 A1* | 3/2007 | Beintner et al. ............... 257/347 |
| 2009/0039361 A1* | 2/2009 | Li et al. ............................ 257/94 |
| 2014/0027860 A1 | 1/2014 | Glass et al. |
| 2014/0252483 A1 | 9/2014 | Nagumo |
| 2015/0380438 A1* | 12/2015 | Chudzik et al. ............... 257/350 |

OTHER PUBLICATIONS

Witters et al., "Strained Germanium Quantum Well pMOS FinFETs Fabricated on in situ Phosphorus-Doped SiGe Strain Relaxed Buffer Layers Using a Replacement Fin Process," International Electron Devices Meeting, IEDM, 2013, pp. 534-537.
List of IBM Patents or Patent Applications Treated as Related; (Appendix P), Filed Feb. 10, 2015; 2 pages.
Bruce B. Doris et al., "CMOS Structure on SSOI Wafer", U.S. Appl. No. 14/618,397, filed Feb. 10, 2015.
Bruce B. Doris et al., "Dual Isolation on SSOI Wafer", U.S. Appl. No. 14/618,442, filed Feb. 10, 2015.
List of IBM Patents or Patent Applications Treated as Related; (Appendix P), Filed Mar. 28, 2016; 2 pages.
Bruce B. Doris et al., "Replacement Fin Process in SSOI Wafer", U.S. Appl. No. 15/082,161, filed Mar. 28, 2016.
Bruce B. Doris et al., "CMOS Structure on SSOI Wafer", U.S. Appl. No. 15/082,180, filed Mar. 28, 2016.
Bruce B. Doris et al., "Dual Isolation on SSOI Wafer", U.S. Appl. No. 15/082,199, filed Mar. 28, 2016.

* cited by examiner

REPLACEMENT FIN PROCESS IN SSOI WAFER

BACKGROUND

The present invention relates to a fin field-effect transistor (finFET), and more specifically, to a replacement fin process in a strained silicon-on-insulator (SSOI) wafer.

A finFET is a type of metal-oxide-semiconductor FET (MOSFET) in which a conducting channel is wrapped by a silicon fin. A finFET device may be a complementary metal-oxide-semiconductor (CMOS) device that includes a p-type metal-oxide-semiconductor (pMOS) finFET device or pFET and an n-type metal-oxide-semiconductor (NMOS) finFET device or nFET formed on a substrate. A silicon-on-insulator (SOI) wafer refers to neutral silicon. When the silicon lattice is bigger than a neutral silicon lattice, the silicon is said to be under tensile strain. This is typically the strain experienced in an SSOI wafer. When the silicon lattice is smaller than a neutral silicon lattice, the silicon is said to be under compressive strain. As noted, a finFET (e.g., CMOS device) may include an n-channel region (nFET) and a p-channel region (pFET) with silicon (Si) and silicon germanium (SiGe) fins, respectively. While an SSOI substrate may improve performance in the nFET, the SSOI substrate may cause mobility degradation in the pFET channel region.

SUMMARY

According to one embodiment of the present invention, a method of forming replacement fins in a complimentary-metal-oxide-semiconductor (CMOS) device that includes a p-type field effect transistor device (pFET) and an n-type field effect transistor device (nFET) includes forming strained silicon (Si) fins from a strained silicon-on-insulator (SSOI) layer in both an nFET region and a pFET region; forming one or more insulating layers over the strained Si fins; forming trenches within the one or more insulating layers so as to expose the strained Si fins in the pFET region only; etching the strained Si fins in the pFET region to expose a buried oxide (BOX) layer of the SSOI layer; etching the exposed portions of the BOX layer to expose a bulk substrate; epitaxially growing a Si portion of pFET replacement fins from the bulk substrate; and epitaxially growing silicon germanium (SiGe) portions of the pFET replacement fins on the Si portion of the pFET replacement fins.

According to another embodiment, a complimentary-metal-oxide-semiconductor (CMOS) device includes an n-type field effect transistor (nFET) region, the nFET region including silicon (Si) fins comprised of strained silicon on an insulator layer that extends across the nFET region; and a p-type field effect transistor (pFET) region, the pFET region including silicon germanium (SiGe) fins on a substrate surrounded by the insulator layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-13 show cross-sectional views of intermediate structures involved in processes to obtain Si fins on an insulator in the nFET region and SiGe fins on silicon in the pFET region according to an embodiment of the invention, in which:

DETAILED DESCRIPTION

As noted above, an SSOI wafer or a wafer that includes strained silicon (typically tensile strained silicon) may prove advantageous for an nFET device but degrade performance in the pFET channel region. Embodiments of the systems and methods detailed herein relate to the release of pFET channel strain while maintaining (tensile) strained SOI in the nFET region.

Figure 1:
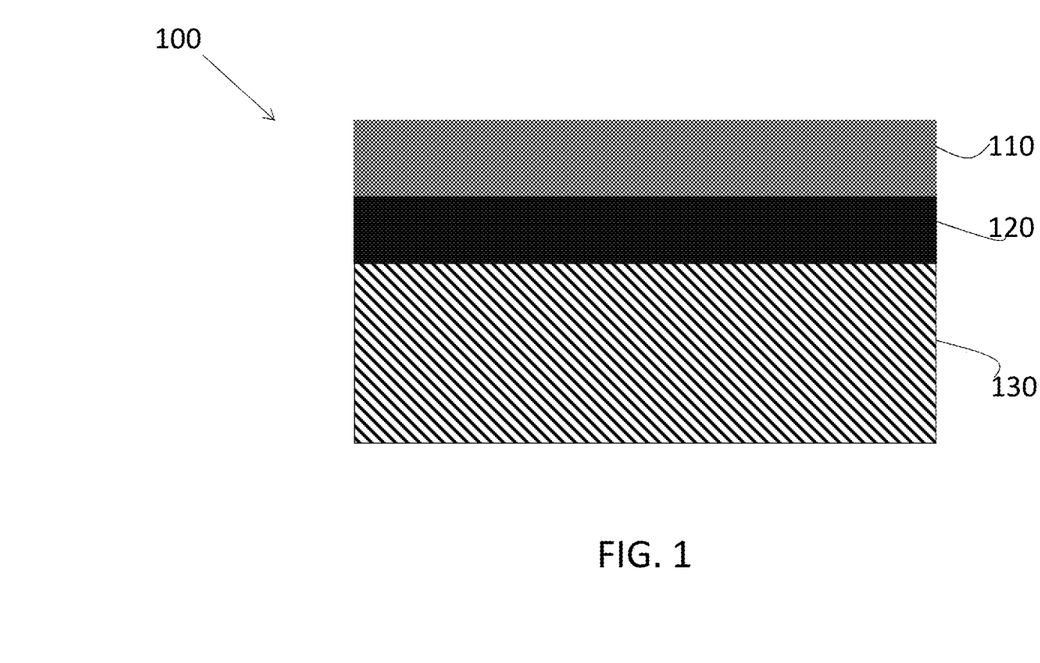
FIG. 1 shows a basic SSOI wafer prior to formation of any fins.
Figure 2:
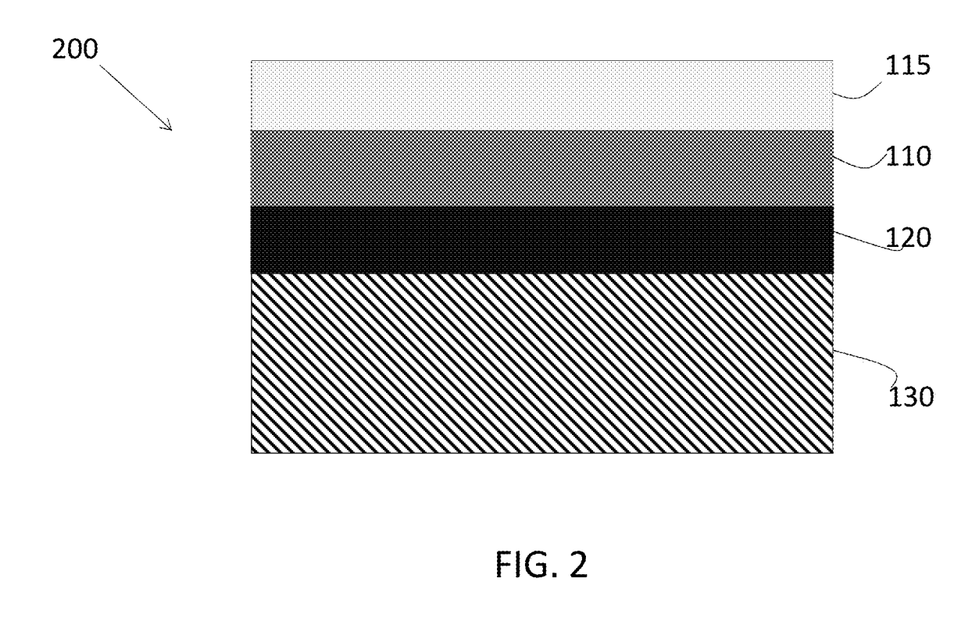
FIG. 2 shows the intermediate structure resulting from depositing a hard mask layer on the SSOI wafer of FIG. 1.

FIGS. 1-13 illustrate the processes involved in forming Si fins from (tensile) strained silicon-on-insulator in the nFET region and forming SiGe fins on the substrate in the pFET region. FIG. 1 is a cross-sectional view of a SSOI wafer 100 used to define a pFET region and an nFET region according to embodiments of the invention. The SSOI wafer 100 includes a strained silicon layer 110 on an insulator 120 (e.g., buried oxide (BOX)). The SSOI wafer 100 may be obtained through known fabrication methods that include, for example, growing a gradient SiGe layer on an Si wafer to form a relaxed SiGe layer, and epitaxially growing an Si layer above the SiGe layer. Because the relaxed SiGe has a larger lattice than Si crystal (neutral), the epitaxially grown Si layer will be tensile strained. Another Si wafer and with OX (as buried oxide) may be formed and then bonded with the strained Si/SiGe/Si substrate wafer on the BOX. (via a wafer bonding technique, for example). Hydrogen (H+ ion) implantation may then be used to cut the SiGe and Si substrate off through a smart-cut technique, for example, and any remaining SiGe layer on Strained Si may be etched off to form the SSOI wafer 100. The insulator 120 is formed on a bulk substrate 130 FIG. 2 shows the intermediate structure 200 that results from depositing a hard mask layer 115 on the strained silicon layer 110. The hard mask layer 115 may be comprised of silicon nitride (SiN) or silicon dioxide ($SiO_2$), for example.

Figure 3:
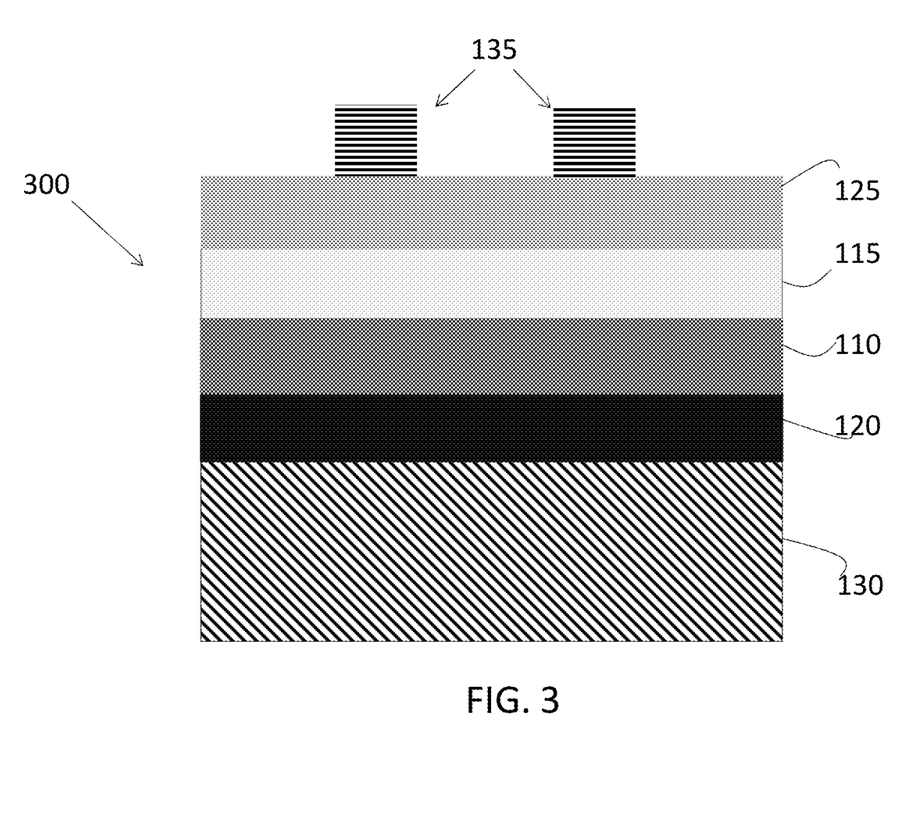
FIG. 3 shows the intermediate structure resulting from deposition of a mandrel followed by a patterned lithographic mask on the structure shown in FIG. 2.
Figure 4:
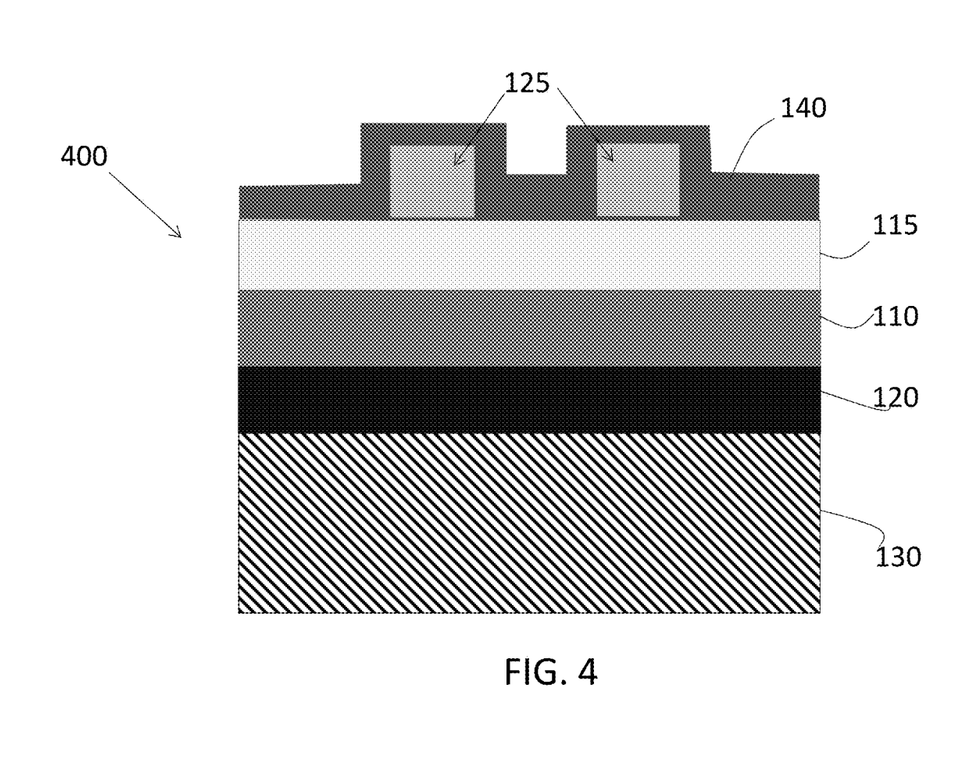
FIG. 4 shows the intermediate structure resulting from patterning the mandrel layer and depositing a spacer material on the structure shown in FIG. 3.
Figure 5:
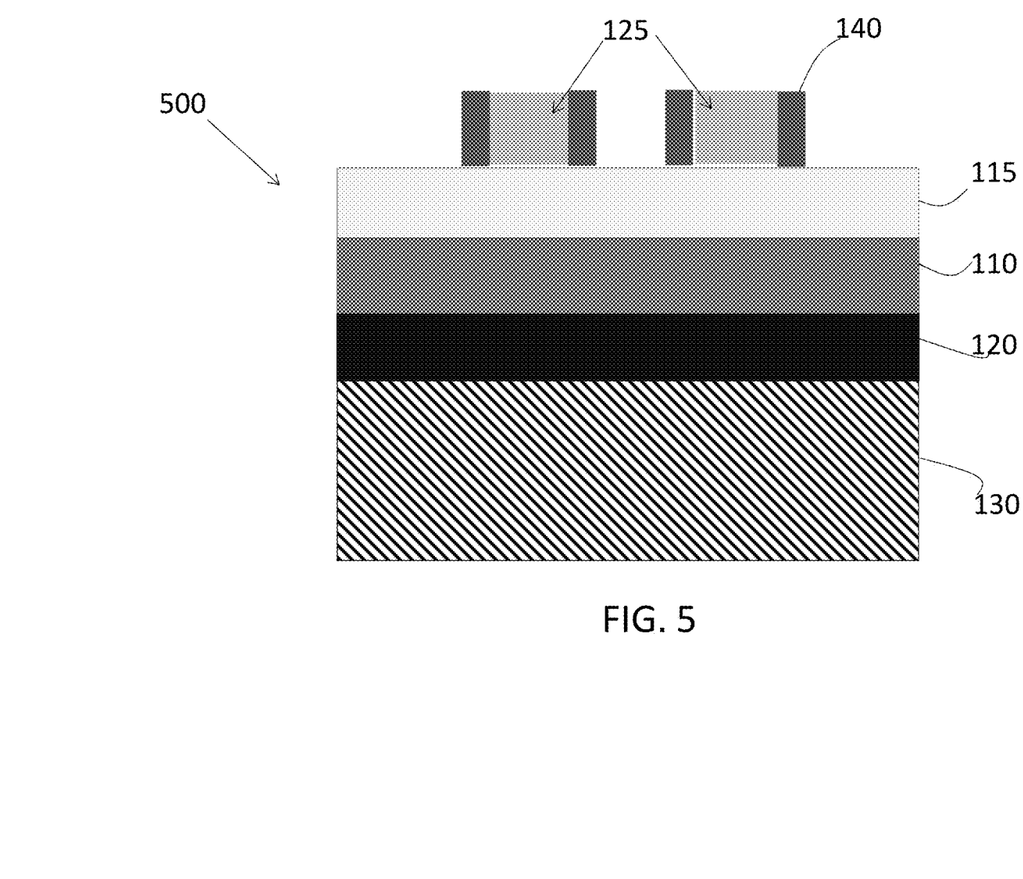
FIG. 5 shows the intermediate structure resulting from etching the spacer material of the structure shown in FIG. 4.
Figure 6:
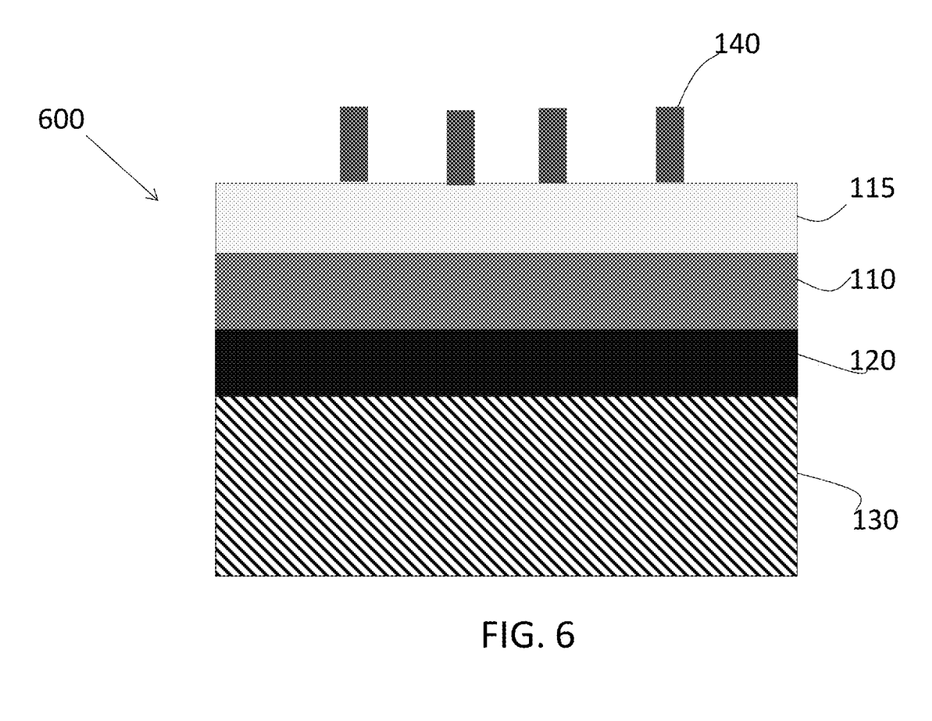
FIG. 6 shows the intermediate structure that results from pulling the mandrel layer from the structure shown in FIG. 5.
Figure 7:
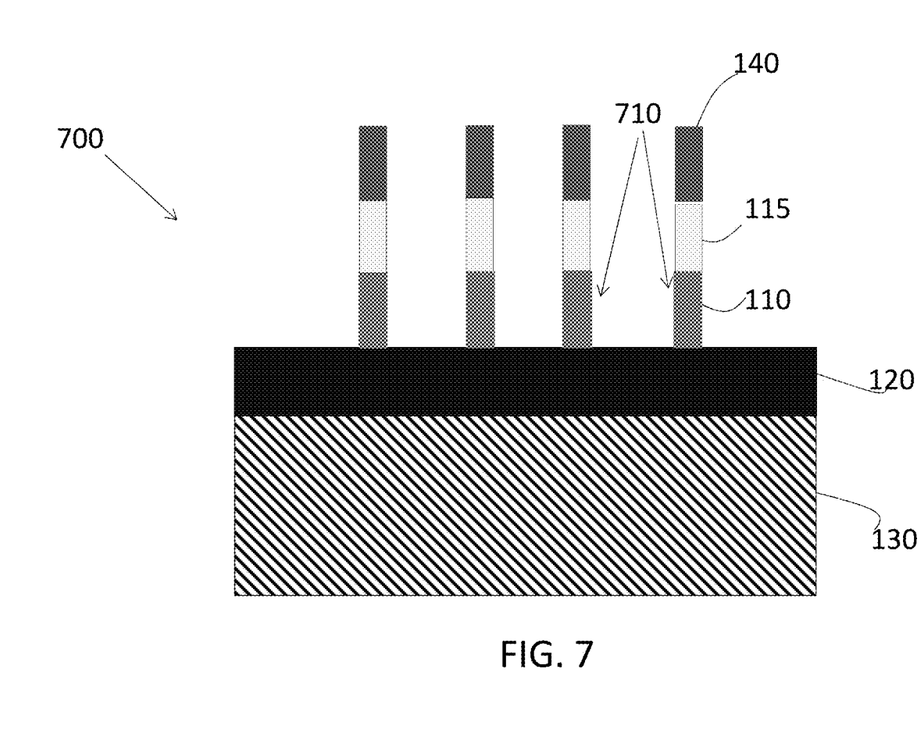
FIG. 7 shows the intermediate structure resulting from etching the hard mask layer and strained silicon layer using the spacer material shown in the structure of FIG. 6 as a pattern.
Figure 8:
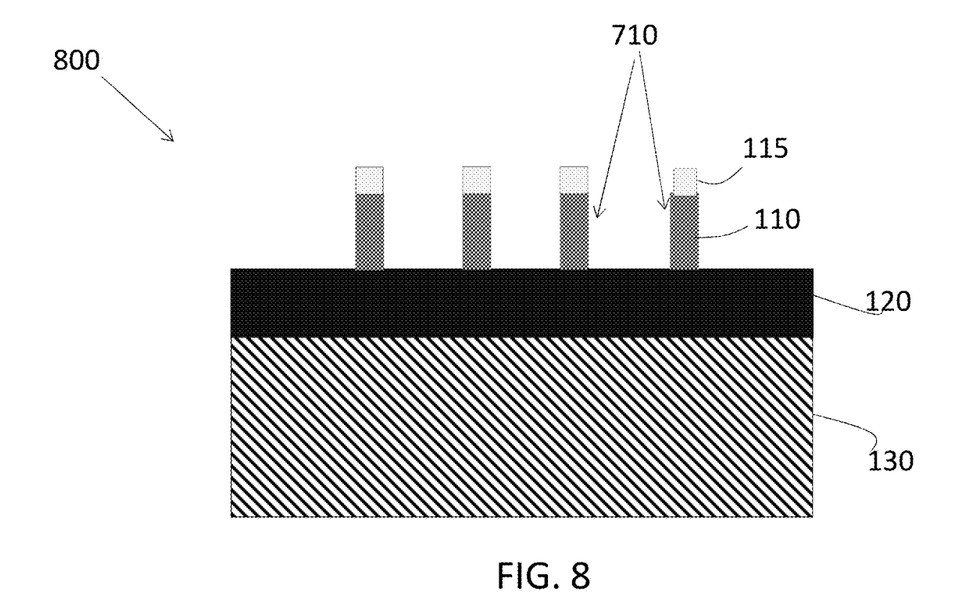
FIG. 8 shows the intermediate structure that results from removing the spacer material and some of the hard mask material from the structure shown in FIG. 7.

FIG. 3 illustrates a structure 300 with a mandrel layer 125 deposited on the hard mask layer 115. The mandrel layer 125 may be amorphous carbon or amorphous silicon (Si), for example. A lithographic mask 135 is patterned over the mandrel layer 125. The lithographic mask may be comprised of a silicon-containing antireflection coating (SiARC), an optical planarization layer, and a photoresist layer, for example. FIG. 4 shows the structure 400 that results from patterning the mandrel layer 125 using the lithographic mask 135 and then depositing a spacer material 140 over the patterned mandrel layer 125. FIG. 5 shows the structure 500 that results from performing an anisotropic (directional) reactive ion etch (RIE) process to etch horizontally disposed portions of the spacer material 140 into sidewall spacers for the patterned mandrel layer 125. Pulling the patterned mandrel layer 125 from the structure 500 of FIG. 5 results in the structure 600 shown in FIG. 6. The remaining spacer material 140 then acts as a pattern to etch the hard mask layer 115 and the strained silicon layer 110 to result in the intermediate structure 700 in FIG. 7. The etching is accomplished by an RIE process, resulting in the Si fins 710. The spacer material 140 and some of the hard mask layer 115 are then stripped, leaving the remaining hard mask layer 115 and the patterned strained silicon layer 110 (Si fins 710) shown in the structure 800 illustrated in FIG. 8.

Figure 9:
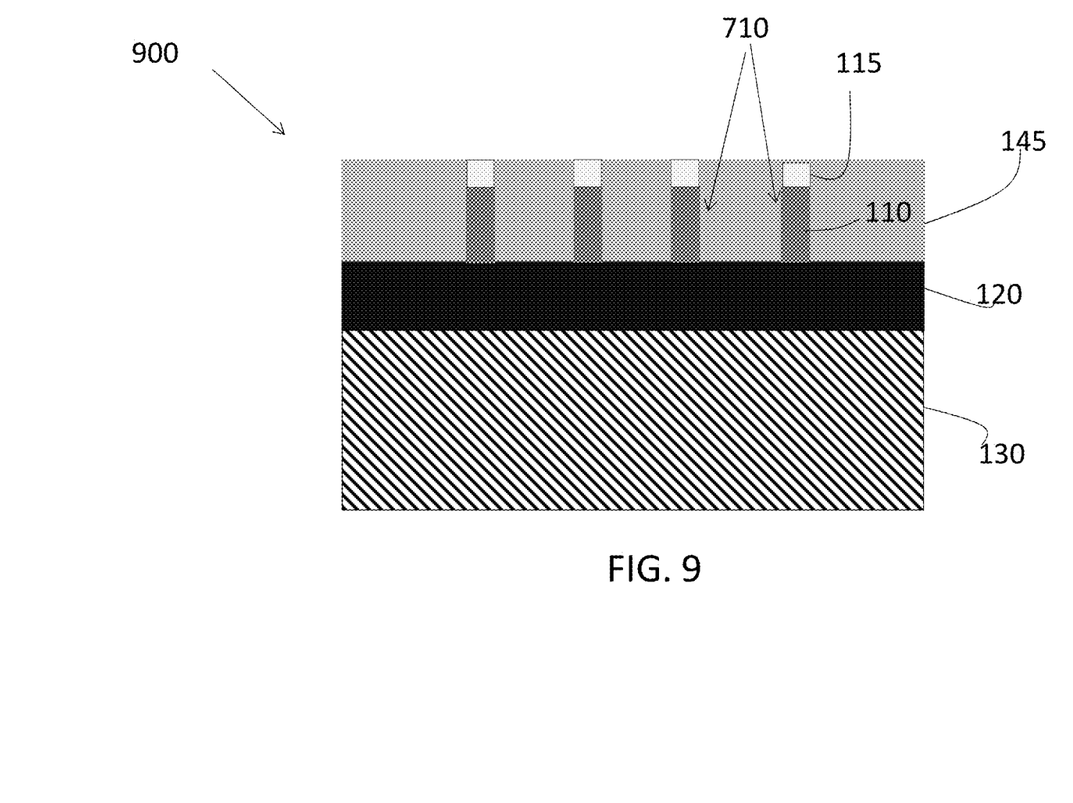
FIG. 9 shows the intermediate structure that results from deposition of a dielectric film on the structure shown in FIG. 8.
Figure 10:
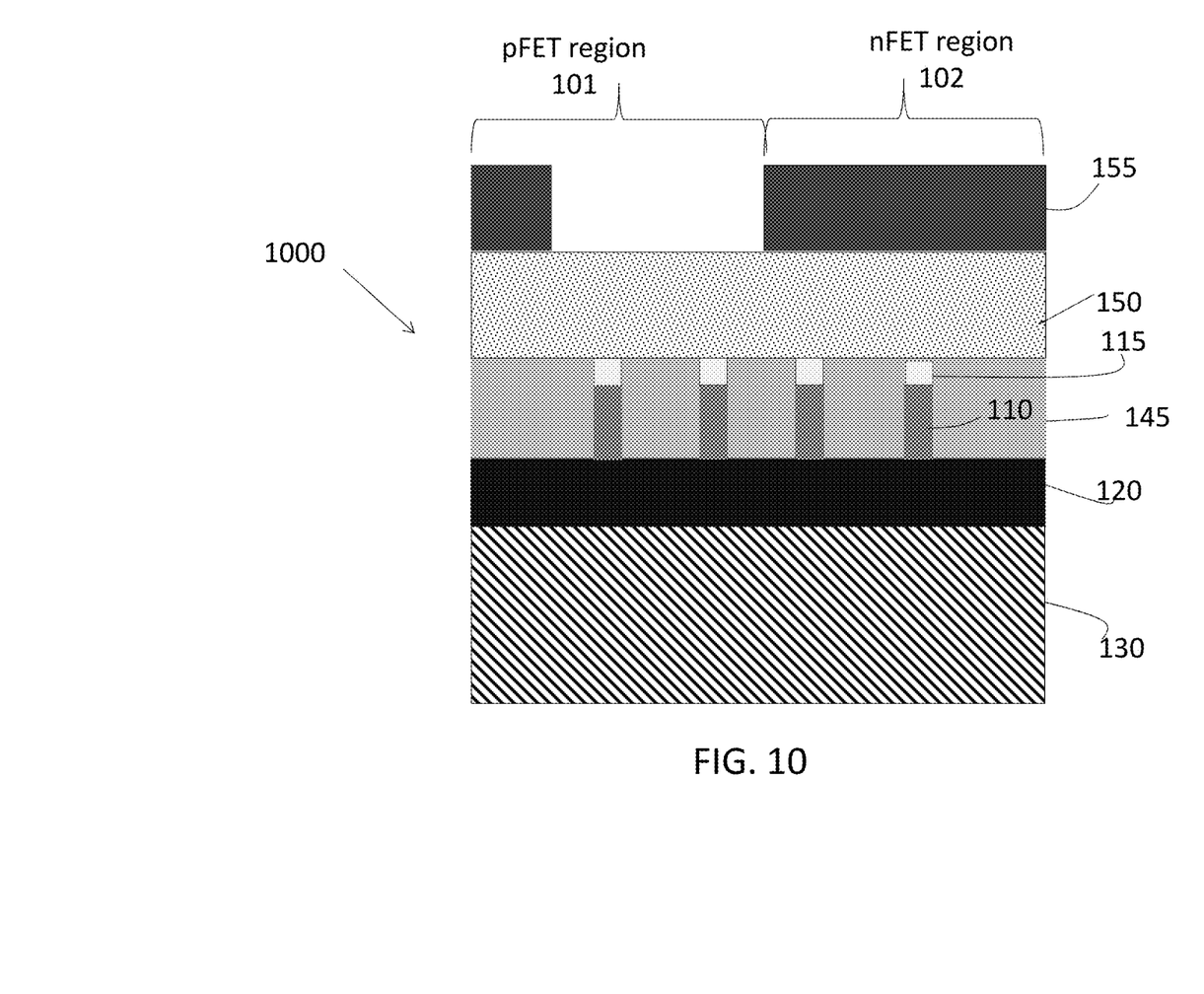
FIG. 10 shows deposition of lithographic layers and patterned photoresist on the structure shown in FIG. 9.
Figure 11:
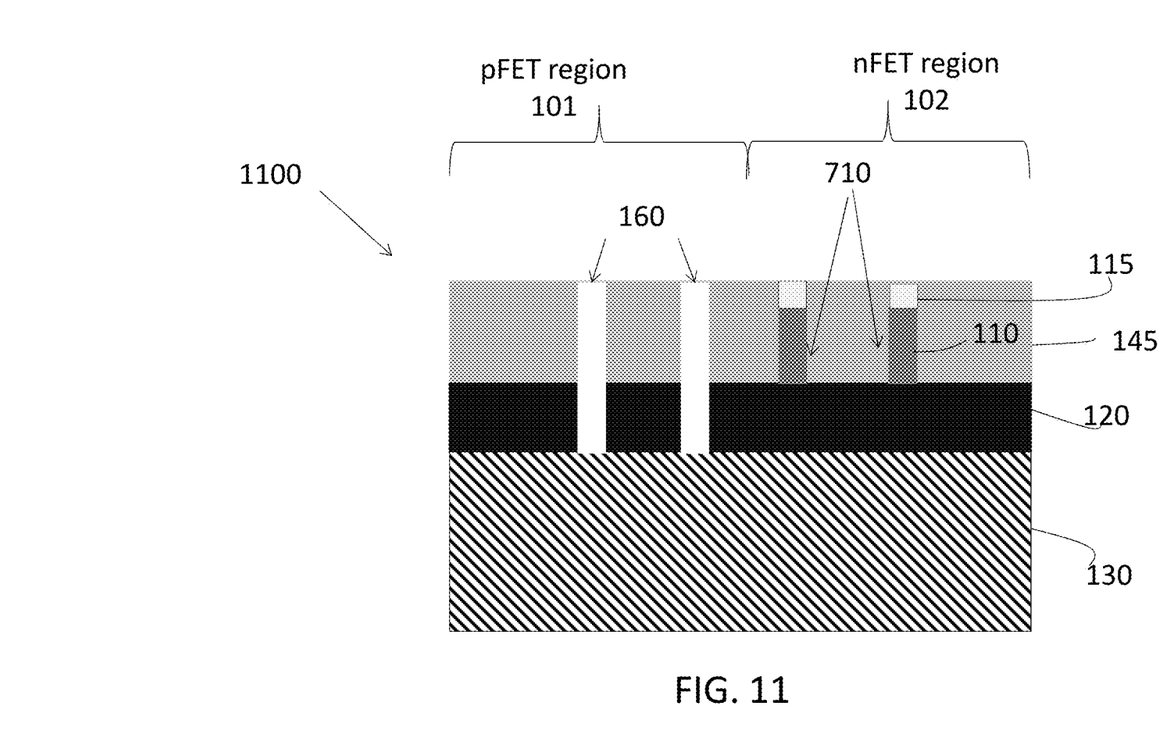
FIG. 11 shows an intermediate structure resulting from an etch of the photoresist and lithographic layers that includes trenches in the pFET region.

FIG. 9 shows an intermediate structure 900 resulting from a dielectric film 145 fill and chemical mechanical planarization (CMP) process. The dielectric film 145 may be an oxide (e.g., $SiO_2$) and may be the same oxide as the buried oxide of the insulator 120. The dielectric film 145 acts as a sacrificial layer or masking layer that facilitates etching of the Si fins 710 in the pFET region 101, as discussed below. FIG. 10 is an intermediate structure 1000 that results from deposition of lithographic layers on the structure 900 shown in FIG. 9. First, a layer 150 of an organic dielectric layer (ODL) and SiARC is deposited over the dielectric film 145 fill and remaining hard mask layer 115. This is followed by deposition and patterning of a photoresist 155. The photoresist 155 covers the nFET region 102 and is patterned over the pFET region 101 so that SiGe fins may be subsequently defined in this region. During an etching process, the photoresist 155 protects the Si fins 710 in the nFET region 102 while the lack of photoresist 155 in the pFET region 101 results in the structure 1100 shown in FIG. 11. As shown in FIG. 11, the etch leaves the Si fins 710 in the nFET region 102 and removes them from the pFET region 101. In the pFET region 101, the etch removes the Si fins 710 and also the insulator 120 beneath the Si fins 710, which defines trenches 160.

Figure 12:
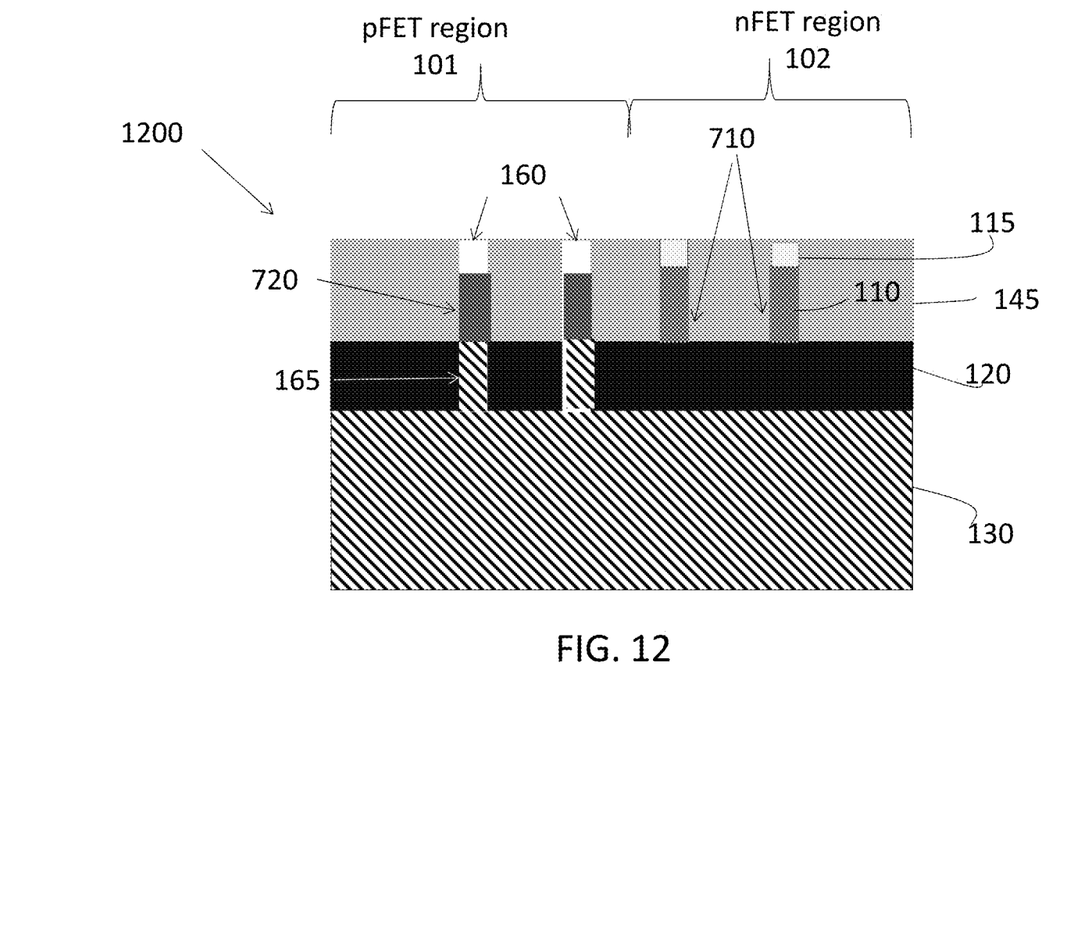
FIG. 12 shows the intermediate structure that results from epitaxial growth of Si and SiGe in the trenches in the pFET region shown in FIG. 11.
Figure 13:
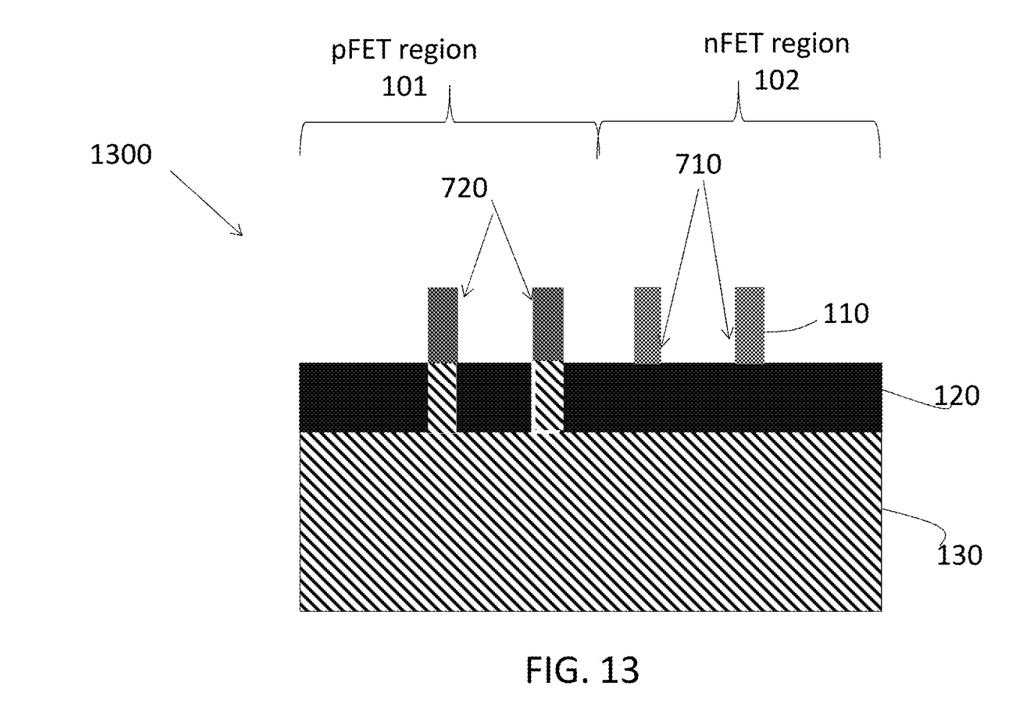
FIG. 13 shows the Si fins on the insulator in the nFET region and the SiGe fins formed directly on the substrate in the pFET region.

FIG. 12 shows an intermediate structure 1200 that results from epitaxial growth of Si (165) and SiGe (720) within the trenches 160 defined by the insulator 120 and dielectric film 145. Epitaxial growth of the Si 165 begins from the substrate 130, as shown. SiGe (forming SiGe fins 720) is then epitaxially grown on the epitaxially grown Si 165. Alternately, Si may be epitaxially grown to form fins rather than the SiGe fins 720. When the fins are SiGe fins 720, there may be neutral or compressive strain. When the fins are Si fins, then there is no strain (neutral fins). The Si 165 and SiGe 720 growth is controlled based on information regarding growth rate such that the Si 165 and SiGe 720 layers are of the desired height. As shown in FIG. 12, the desired height of the epitaxially grown Si 165 may be about the height of the insulator layer 120. According to the embodiment shown in FIG. 12, the desired height of the SiGe fins 720 is about the same height as the Si fins 710. FIG. 13 shows the structure 1300 that results from etching the remaining hard mask layer 115 (e.g., SiN). When the hard mask layer 115 is SiN and the dielectric film 145 fill is $SiO_2$, the hard mask layer 115 may be removed using an etching process that is selective to $SiO_2$ and the Si and SiGe fin 710, 720 materials. This etch may use a hot phosphorous solution (with a temperature of less than 100 degrees Celsius). The dielectric film 145 may then be etched back using an RIE process. Based on the etching rate and etching time, the depth of the etching performed via RIE may be determined. This etch is selective to the Si and SiGe fin 710, 720 materials. As FIG. 13 shows, the pFET region 101 includes SiGe fins 720. More importantly, the SiGe fins 720 are formed directly on the substrate 130 material (no SSOI in the pFET region 101). The nFET region 102 includes Si fins 710 and, more importantly, retains the strained silicon (Si fins 710) on the insulator 120 (SSOI). The structure 1300 is further processed, according to known processes, to form other aspects of the CMOS that includes both an nFET device and a pFET device. Each device of the CMOS includes a source terminal, a drain terminal, a gate terminal, and their associated contacts. The fins 710, 720 form the channel regions between the source terminal and drain terminal in each respective device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming replacement fins in a complimentary-metal-oxide-semiconductor (CMOS) device that includes a p-type field effect transistor device (pFET) and an n-type field effect transistor device (nFET), the method comprising:
    forming strained silicon (Si) fins from a strained silicon-on-insulator (SSOI) layer in both an nFET region and a pFET region;
    forming one or more insulating layers over the strained Si fins;
    forming trenches within the one or more insulating layers so as to expose the strained Si fins in the pFET region only;
    etching the strained Si fins in the pFET region to expose a buried oxide (BOX) layer of the SSOI layer;
    etching the exposed portions of the BOX layer to expose a bulk substrate;
    epitaxially growing a Si portion of pFET replacement fins from the bulk substrate; and
    epitaxially growing silicon germanium (SiGe) portions of the pFET replacement fins on the Si portion of the pFET replacement fins.

2. The method according to claim 1, wherein the forming the trenches includes defining the trenches by a dielectric film fill around the Si fins and the BOX layer.

3. The method according to claim 2, wherein the epitaxially growing the Si portion of the pFET replacement fins includes controlling a size of growth to keep the Si portion of the pFET replacement fins at or below a height of the BOX layer.

4. The method according to claim 3, wherein the epitaxially growing the SiGe portion of the pFET replacement fins includes controlling a size of growth to keep the SiGe portion of the pFET replacement fins a same height as the Si fins in the nFET region.

5. The method according to claim 1, wherein the forming the Si fins includes patterning a spacer material on a hard mask layer above a strained silicon layer and etching the hard mask layer and the strained silicon layer according to a pattern of the spacer material.

6. The method according to claim 1, wherein the etching the Si fins and the BOX layer in the pFET region includes using a lithographic layer and a patterned photoresist layer, the patterned photoresist layer including gaps aligned with the trenches.

7. The method according to claim 1, wherein the etching the Si fins in the pFET region includes retaining the Si fins in the nFET region.

8. The method according to claim 1, wherein the forming the strained Si fins includes forming tensile strained Si fins.

9. The method according to claim 1, wherein the forming the one or more insulating layers includes forming a layer of an organic dielectric layer (ODL) or a silicon-containing antireflection coating (SiARC).

* * * * *